United States Patent [19]

Meunier et al.

[11] 4,183,602
[45] Jan. 15, 1980

[54] FRONT PANEL FOR CIRCUIT BOARDS

[75] Inventors: Gérard Meunier, Strasbourg; André Tisserand, Fegersheim, both of France

[73] Assignee: La Telephonie Industrielle et Commerciale-Telic, Strasbourg, France

[21] Appl. No.: 919,657

[22] Filed: Jun. 28, 1978

[30] Foreign Application Priority Data

Jul. 21, 1977 [FR] France .................... 77 22359

[51] Int. Cl.² ........................................... H01R 13/62
[52] U.S. Cl. ........................................... 339/45 M
[58] Field of Search ............... 339/17 R, 17 L, 45 R, 339/45 M, 75 MP; 361/399, 413, 415

[56] References Cited
U.S. PATENT DOCUMENTS

| T876,004 | 7/1970 | Andreini et al. | 339/75 MP |
| 3,833,839 | 9/1974 | Debaigt | 361/399 |
| 4,064,551 | 12/1977 | Lightfoot | 339/45 M |

FOREIGN PATENT DOCUMENTS 1238534  4/1967  Fed. Rep. of Germany ........ 339/91 R
2548822  5/1977  Fed. Rep. of Germany .

OTHER PUBLICATIONS

IBM Tech. Discl. Bulletin, Clarke et al. vol. 10, No. 7, pp. 1014–1015, 12–1967.

*Primary Examiner*—Neil Abrams
*Attorney, Agent, or Firm*—Sughrue, Rothwell, Mion, Zinn and Macpeak

[57] ABSTRACT

A front panel for circuit boards e.g. in a telecommunications exchange which plug into connectors attached to a bin, the boards sliding in guides in said bin. Such circuit boards can be difficult to remove from the bin because of multiple contacts in the connectors. The panel is intended to facilitate extraction of its board and comprises a bar of insulative material acting as a stiffener for the board, fitting over the front edge thereof, and an extractor lever articulated to the base of the stiffener bar.

7 Claims, 3 Drawing Figures

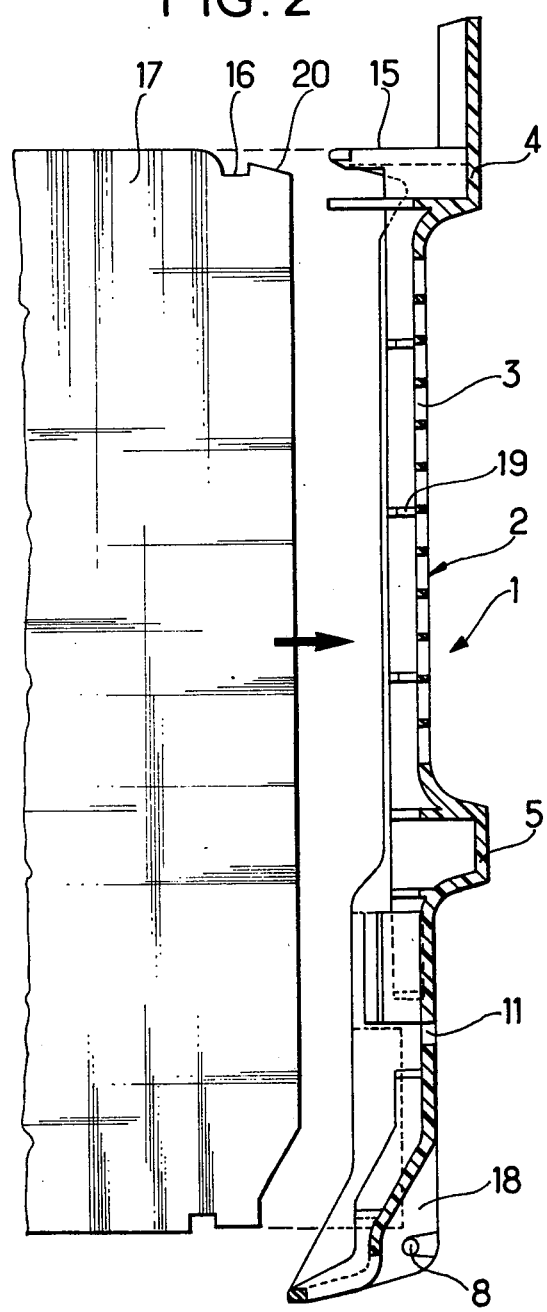
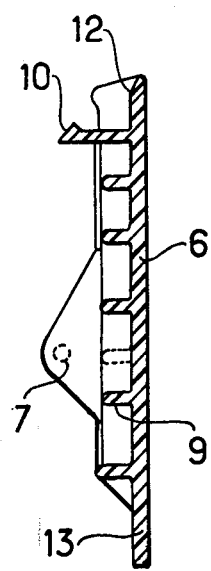

FRONT PANEL FOR CIRCUIT BOARDS

FIELD OF THE INVENTION

The invention relates to circuit boards which plug into connectors attached to a bin, the boards sliding in guides in the bin, and in particular to printed circuit boards and component support boards. The invention is of particular application to telecommunications circuit boards including a large number of connection points.

BACKGROUND OF THE INVENTION

Circuit boards engaged in the guides in the corresponding bin require reinforcement of the front portion to enable them to be extracted from the connectors into which they plug and to be replaced in those connectors. As a general rule, this front portion comprises a handle which does not enable a card to be extracted easily, in view of the large number of connecting pins which must be pulled out of the connector simultaneously.

The invention is intended to provide a front panel for circuit boards including a built-in extractor.

SUMMARY OF THE INVENTION

The invention consists in a front panel for circuit boards which plug into connectors attached to a bin, the boards sliding in guides in said bin, and wherein the front panel comprises a bar of insulated material acting as a stiffener for the board, fitting over the front edge thereof, and an extractor lever articulated to the base of the stiffener bar.

An embodiment of the invention is described hereinafter by way of example only and with reference to the figures of the accompanying drawings.

BRIEF DESCRIPTION OF THE DRAWINGS

FIG. 2 is a side elevation view of a front panel showing the associated circuit board, and FIG. 3 is a side elevation view of the extractor.

DESCRIPTION OF THE PREFERRED EMODIMENT

Figure 1:
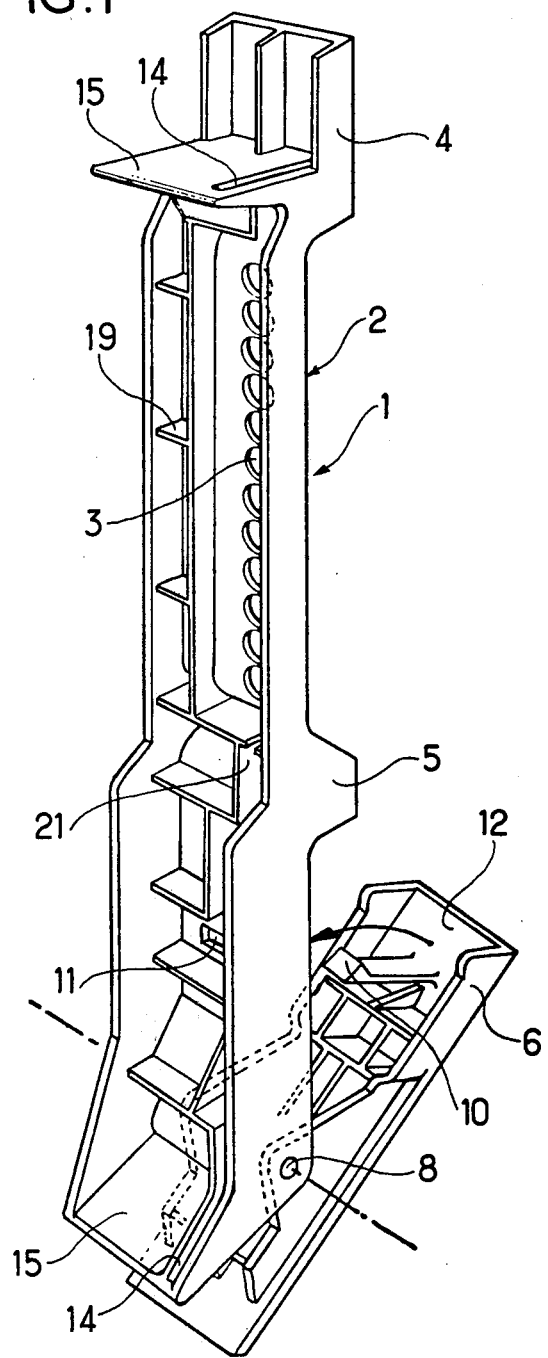
FIG. 1 is a perspective view of a front panel for circuit boards in accordance with the invention.

In the embodiment of the invention shown in the figures, the front panel comprises a bar 1 injection moulded from a plastics material such as polyoxythenylene, acting as a stiffener for the circuit board. Seen from the front, this bar 1 is of rectangular shape and includes a flat section 2 incorporating holes 3 through which display, test or switching devices may be viewed. Above and below this flat section are bosses 4 and 5. The boss 4 may be used as a label holder. Beneath the boss 5 is an extractor lever 6 with a spindle 7 which turns in 2 holes 8 formed in the base of the stiffener 1.

The extractor lever is also flat when seen from the front, and is made from the same material as the stiffener 1. Its rear surface incorporates reinforcing ribs 9 and a hook 10 which is designed to engage in a corresponding hole 11 in the stiffener. The extractor includes a hollowed out portion 12 at the top in which a finger may be placed in order to pivot the extractor lever. At its base is a flat portion 13 which is designed to bear against the edge of the bin in which the circuit boards are accommodated.

At the top and bottom of the stiffener 1, slots 14 are formed in two lugs 15 and are located so as to engage corresponding notches 16 in the board 17. The bottom portion of the stiffener includes a hollowed out portion 18 permitting the rotation of the supports for the spindle 7 of the extractor lever 6. On the rear surface of the stiffener 1 are reinforcing ribs 19 on which test, switching and display devices may be mounted. In particular, these ribs may be used for mounting a support for light emitting diodes which locates the diodes so that they are aligned with and centred relative to the holes 3 provided for this purpose in the front surface of the stiffener. The slots 14 are located at one edge of the stiffener, so that the stiffener is asymmetrical and the circuit board is offset to provide room for the components mounted on the board. A vertical rib 21 acts as a board guide.

FIG. 1 shows the rotational movement of the extractor lever relative to the stiffener. By rotating the extractor lever, which bears against the base of the bin, it is easy to withdraw the board from its connector.

FIG. 2 shows how the stiffener 1 may be fitted to the edge of the board. By moving the board in the direction of the arrow, the stiffener fits over the front edge of the board, the two lugs 15 engaging the notches 16 in the board and the hook 20 on the board engaging in the slot 14.

The advantages to be gained from the application of preferred embodiments of the invention are as follows:

The circuit board front panel in accordance with the invention consists of two moulded components and acts as:

a stiffener for the board,
a decorative fascia for the front edge of the board,
a board extractor, and
a support for test, display and switching devices.

These functions are combined and integrated into a single unit of rectangular format and attractive appearance.

It will be understood that the invention is not limited to the embodiment described and represented herein, and that it is possible, without departing from the scope of the invention, to replace any feature thereof by its mechanical equivalent.

We claim:

1. A front panel for circuit boards which plug into connectors attached to a bin, said boards sliding transversely within guides carried by said bin, said boards further bearing notches on opposite sides and adjacent one end thereof, said front panel comprising a bar of insulated material defining a stiffener for the board, said stiffener comprising lugs at opposite ends, said lugs incorporating slots engaging corresponding ones of said notches and which notches form hooks for said lugs, said stiffener carrying a central boss intermediate of said lugs, an extractor lever articulated to the stiffener bar, beneath the central boss for pivoting into coplanar position with said stiffener, and with its outer surface flush with the face of said boss and to thereby blend with the stiffener.

2. A front panel according to claim 1, wherein the stiffener includes holes in its front surface for display purposes, said holes being offset relative to the axis of the stiffener.

3. A front panel according to claim 1, wherein the extractor incorporates a hook for engaging a corresponding hole in the stiffener.

4. A front panel according to claim 1, wherein the slots are located at the edges of the stiffener lugs so that the stiffener is asymmetrically located relative to the circuit board.

5. A front panel according to claim 1, wherein the stiffener and the extractor are made from an insulative material.

6. A front panel according to claim 5, wherein the stiffener and the extractor are injection moulded from a plastics material.

7. A front panel according to claim 1, wherein the front panel comprises a support for test, display and switching devices.

* * * * *